US010147678B2

(12) United States Patent
Iwamoto

(10) Patent No.: US 10,147,678 B2
(45) Date of Patent: Dec. 4, 2018

(54) TRIMMING DEVICE

(71) Applicant: FUJI ELECTRIC CO., LTD., Kawasaki-shi, Kanagawa (JP)

(72) Inventor: Motomitsu Iwamoto, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/691,045

(22) Filed: Aug. 30, 2017

(65) Prior Publication Data

US 2018/0076136 A1 Mar. 15, 2018

(30) Foreign Application Priority Data

Sep. 15, 2016 (JP) .................................. 2016-180133

(51) Int. Cl.
| | |
|---|---|
| *H01L 23/525* | (2006.01) |
| *G11C 19/28* | (2006.01) |
| *G11C 17/16* | (2006.01) |
| *G11C 17/18* | (2006.01) |
| *G11C 29/02* | (2006.01) |
| *G11C 29/44* | (2006.01) |

(52) U.S. Cl.
CPC .......... *H01L 23/5256* (2013.01); *G11C 17/16* (2013.01); *G11C 17/18* (2013.01); *G11C 19/28* (2013.01); *G11C 29/027* (2013.01); *G11C 29/028* (2013.01); *G11C 2029/4402* (2013.01)

(58) Field of Classification Search
CPC .................................................. H01L 23/5256
See application file for complete search history.

(56) References Cited

U.S. PATENT DOCUMENTS

| | | | | |
|---|---|---|---|---|
| 5,361,001 A | * | 11/1994 | Stolfa | H03K 17/693 327/312 |
| 5,450,030 A | * | 9/1995 | Shin | H01L 27/0207 257/E27.047 |
| 5,767,732 A | * | 6/1998 | Lee | H01L 27/0802 257/E27.047 |
| 5,838,076 A | * | 11/1998 | Zarrabian | H03K 17/693 307/115 |
| 6,121,820 A | * | 9/2000 | Shishikura | G11C 29/02 257/E23.15 |
| 6,462,609 B2 | * | 10/2002 | Hashimoto | H03M 1/1057 327/334 |

FOREIGN PATENT DOCUMENTS

JP        H05-63090 A        3/1993

* cited by examiner

*Primary Examiner* — Jeffery S Zweizig
(74) *Attorney, Agent, or Firm* — Rabin & Berdo, P.C.

(57) ABSTRACT

In a trimming device, a counter circuit generates n-bit setting data for n-bit trimming data used to trim the trimmed circuit. A trimming data generation circuit includes trimming elements whose conductive parts are blown when an electrical signal flows therein, pull-up resistors connected to high potential sides of the trimming elements, switches connected to the high potential sides of the trimming elements, and buffers. The trimming data generation circuit switches the switches in accordance with a level of the setting data, and generates the trimming data that is inputted to the trimmed circuit, via the buffers, from nodes at which the pull-up resistors and the trimming elements are connected to each other.

11 Claims, 11 Drawing Sheets

| BIT WIDTH OF TRIMMED CIRCUIT | 4bit | | 5bit | | 6bit | | 7bit | |
|---|---|---|---|---|---|---|---|---|
| | OPERATION CHECK BEFORE FUSE BLOWING | THE NUMBER OF TRANSISTORS USED | OPERATION CHECK BEFORE FUSE BLOWING | THE NUMBER OF TRANSISTORS USED | OPERATION CHECK BEFORE FUSE BLOWING | THE NUMBER OF TRANSISTORS USED | OPERATION CHECK BEFORE FUSE BLOWING | THE NUMBER OF TRANSISTORS USED |
| TRIMMING CIRCUIT 20 | IMPOSSIBLE | | IMPOSSIBLE | | IMPOSSIBLE | | IMPOSSIBLE | |
| TRIMMING CIRCUIT 30 | POSSIBLE | 66 | POSSIBLE | 82 | POSSIBLE | 98 | POSSIBLE | 114 |
| TRIMMING DEVICE 1-2 | POSSIBLE | 4 | POSSIBLE | 5 | POSSIBLE | 6 | POSSIBLE | 7 |

| COMPARED CIRCUITS | ADVANTAGEOUS EFFECT OVER COMPARED CIRCUITS | REASON |
|---|---|---|
| TRIMMING CIRCUIT 20 | TRIMMING DEVICE 1-2 IMPROVES YIELD | TRIMMING DEVICE 1-2 ALLOWS A USER TO CHECK A STATE PRODUCED AFTER A FUSE IS BLOWN, BEFORE THE FUSE IS BLOWN |
| TRIMMING CIRCUIT 30 | CHIP COST OF TRIMMING DEVICE 1-2 BECOMES LOWER, REGARDLESS OF BIT WIDTH OF TRIMMED CIRCUIT | THE NUMBER OF TRANSISTORS OF TRIMMING DEVICE 1-2 IS REDUCED, REGARDLESS OF BIT WIDTH OF TRIMMED CIRCUIT, WHICH REDUCES CHIP AREA |

FIG. 8

TRIMMING DEVICE

CROSS-REFERENCE TO RELATED APPLICATION

This application is based upon and claims the benefit of priority of the prior Japanese Patent Application No. 2016-180133, filed on Sep. 15, 2016, the entire contents of which are incorporated herein by reference.

BACKGROUND OF THE INVENTION

1. Field of the Invention

The embodiments discussed herein are related to a trimming device.

2. Background of the Related Art

In a circuit component such as an integrated circuit (IC), a deviation from specification values of an electrical characteristic of the circuit component commonly occurs due to variations in production. When this deviation exceeds a tolerance value, the deviation may become a cause of an error and affect circuit operation. For this reason, in developing semiconductor devices, trimming is performed to correct the deviation from the specification values of the electrical characteristic. Examples of electrical characteristics that are trimmed by trimming circuits include resistance, capacitance, and inductance.

In a trimming circuit, a bit value for a trimmed circuit is commonly set by blowing a predetermined fuse in accordance with signals inputted from pads.

In a conventional art, there is proposed a technique in which, before a fuse is blown, the same state as a state where the fuse is blown is produced in an IC to check an operation of the IC, which is performed after the fuse is blown.

See Japanese Laid-open Patent Publication No. 05-63090.

In some of the conventional trimming circuits, a user is not able to check, before a fuse is actually blown, a state produced after the fuse is blown. An electrical characteristic value is not always within specifications after the fuse is blown. So, yield is disadvantageously reduced if a user is not able to check, before a fuse is blown, a state produced after the fuse is blown (yield is obtained by subtracting the number of rejected products from the number of products produced in a production line, and by determining a ratio of the resulting number to the number of products).

By contrast, a trimming circuit of the above-described conventional art (see Japanese Laid-open Patent Publication No. 05-63090) causes a shift register and a selector to process input data from pads, and allows a user to check a state produced after a fuse is blown. In the case of the trimming circuit of the above-described conventional art (see Japanese Laid-open Patent Publication No. 05-63090), however, as a bit width to be set for a trimmed circuit increases, the number of transistors also increase, which increases a chip area.

SUMMARY OF THE INVENTION

In one aspect of the embodiments of the present invention, there is provided a trimming device for adjusting an electrical characteristic value of a trimmed circuit. The trimming device includes a counter circuit configured to generate n-bit setting data for n-bit trimming data used to trim the trimmed circuit, where n is three or more; and a trimming data generation circuit. The trimming data generation circuit includes: n number of trimming elements whose conductive parts are blown when an electrical signal flows therein, n number of pull-up resistors connected to high potential sides of the trimming elements, n number of switches connected to the high potential sides of the trimming elements, and n number of buffers. The trimming data generation circuit switches the switches in accordance with a level of the setting data and generates the trimming data that is inputted to the trimmed circuit, via the buffers, from nodes at which the pull-up resistors and the trimming elements are connected to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 illustrates a comparison result on operation check before fuse blowing, and on the number of transistors;

FIG. 8 illustrates a comparison result on advantageous effects;

DETAILED DESCRIPTION OF THE INVENTION

Hereinafter, some embodiments will be described in reference to the accompanying drawings.

First Embodiment

Figure 1:
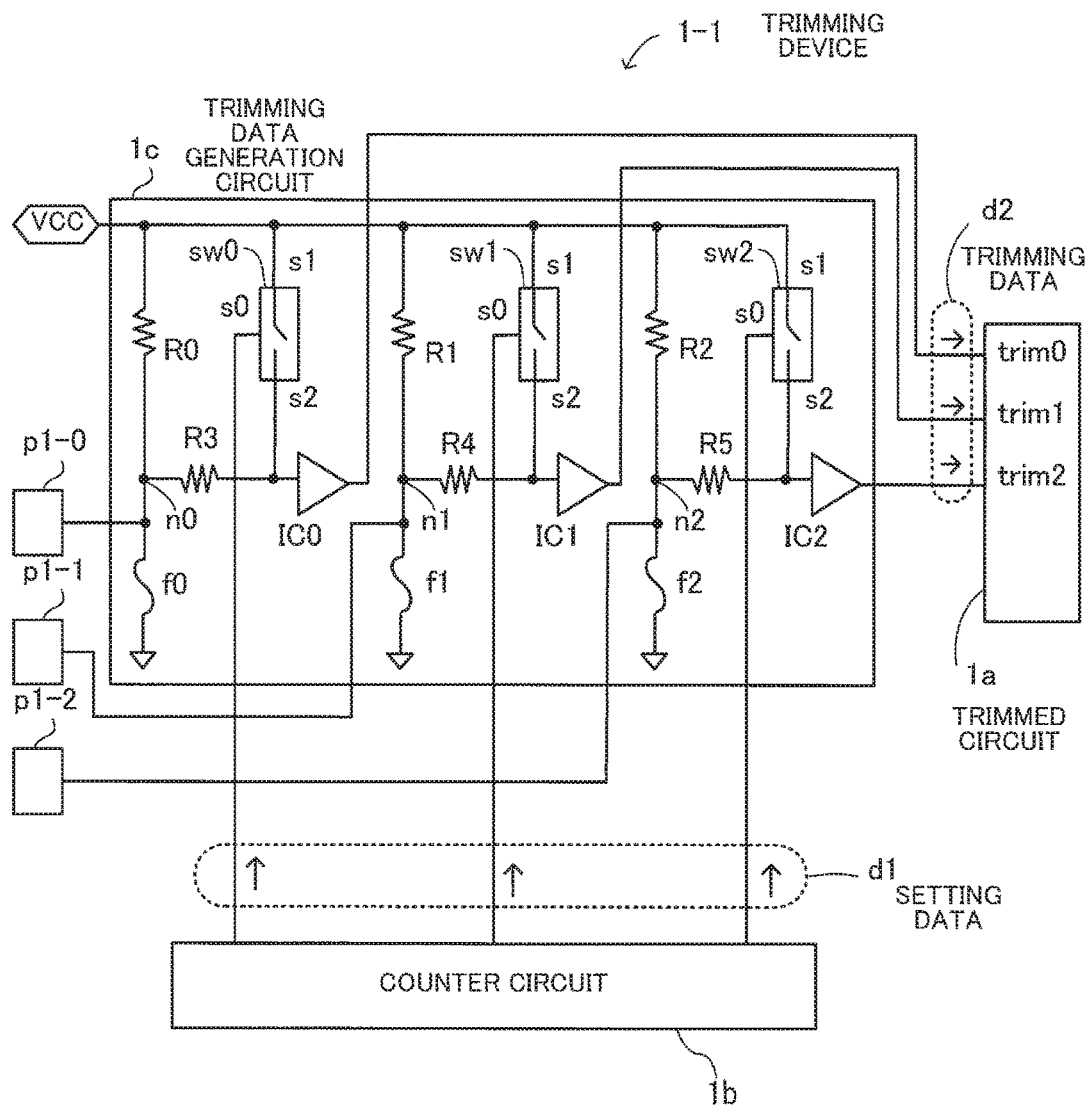
FIG. 1 illustrates an example of a configuration of a trimming device of a first embodiment.

FIG. 1 illustrates an example of a configuration of a trimming device of a first embodiment. A trimming device 1-1 is a device to adjust an electrical characteristic value of a trimmed circuit 1a, and includes a counter circuit 1b and a trimming data generation circuit 1c.

The trimmed circuit 1a is, for example, a device for which a bit value is set and the trimming is performed. In FIG. 1, the bit width is 3 bits (trim0 to trim2).

If trimming data d2 used for trimming the trimmed circuit 1a is n bits (n3), the counter circuit 1b generates n-bit setting data d1. In this example, since n=3, the counter circuit 1b generates 3-bit setting data d1.

The trimming data generation circuit 1c includes trimming elements f0 to f2, resistors R0 to R5, switches sw0 to sw2, and buffers IC0 to IC2. The resistors R0 to R2 are pull-up resistors. The resistors R3 to R5 are protective resistors that prevent high voltages from being applied to the buffers IC0 to IC2 to protect the buffers IC0 to IC2.

The trimming elements f0 to f2 are elements whose conductive parts are blown when an electrical signal having more than a rated current or voltage flows in the elements. In FIG. 1, fuses are used as the trimming elements, as an example (hereinafter, the trimming elements are referred to as fuses). Alternatively, zener diodes may be used in place of the fuses to perform zener-zap trimming.

Components of the trimming data generation circuit 1c are connected as follows. One end of the pull-up resistors R0 to R2 and terminals s1 of the switches sw0 to sw2 are connected to a power supply VCC.

The other end of the pull-up resistor R0 is connected to a pad p1-0, one end of the resistor R3, and one end of the fuse f0. The other end of the pull-up resistor R1 is connected to a pad p1-1, one end of the resistor R4, and one end of the fuse f1. The other end of the pull-up resistor R2 is connected to a pad p1-2, one end of the resistor R5, and one end of the fuse f2. The other ends of the fuses f0 to f2 are connected to ground (hereinafter referred to as GND). Electrical signals are applied to the pads p1-0 to p1-2 to actually blow the fuses f0 to f2.

The other end of the resistor R3 is connected to a terminal s2 of the switch sw0 and the input terminal of the buffer IC0. The other end of the resistor R4 is connected to a terminal s2 of the switch sw1 and the input terminal of the buffer IC1. The other end of the resistor R5 is connected to a terminal s2 of the switch sw2 and the input terminal of the buffer IC2.

Terminals s0 of the switches sw0 to sw2 are switching control terminals, and connected to an output part of the counter circuit 1b to receive the setting data d1. The output terminals of the buffers IC0 to IC2 are connected to trimming setting terminals, trim0 to trim2, of the trimmed circuit 1a.

Here, the trimming data generation circuit 1c switches the switches sw0 to sw2 in accordance with a level of the setting data d1 outputted from the counter circuit 1b.

In addition, the trimming data generation circuit 1c generates the trimming data d2, which is inputted to the trimmed circuit 1a via the buffers IC0 to IC2 from nodes n0 to n2, at which the pull-up resistors R0 to R2, the resistors R3 to R5, the trimming elements f0 to f2, and the pads p1-0 to p1-2 are connected with each other. The trimming data d2 is generated such that the voltages at the nodes n0 to n2 are buffered by the buffers IC0 to IC2 and sent to the trimmed circuit 1a.

With such a configuration of the trimming device 1-1, a state produced after a fuse is blown is checked before the fuse is actually blown. This improves yield. In addition, even though the bit width of the trimmed circuit 1a is increased, the number of transistors of the trimming device 1-1 is prevented from increasing, and thus the chip area is reduced.

Problems to be Solved

Figure 2:
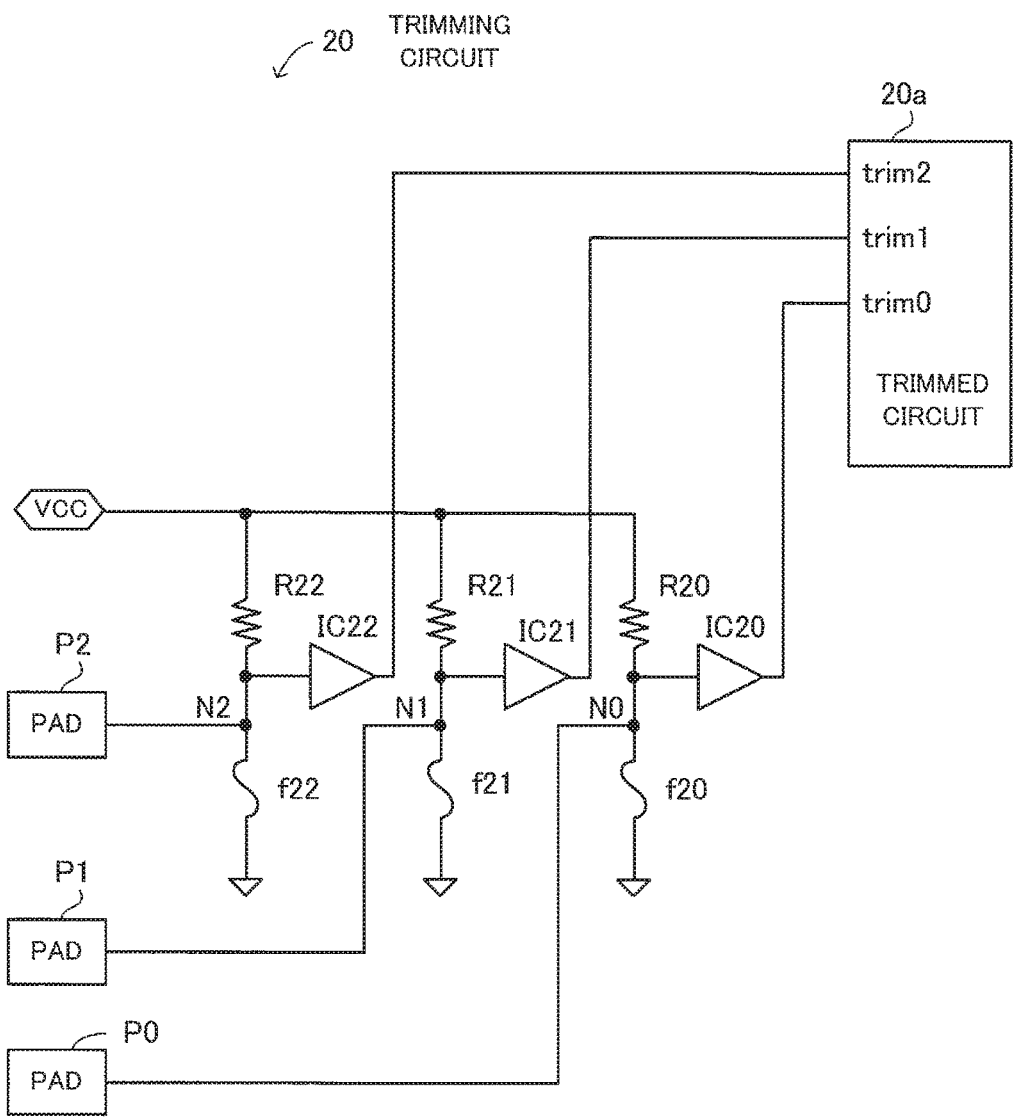
FIG. 2 illustrates an example of a configuration of a trimming circuit.

Before the embodiments are described in detail, problems to be solved will be described with reference to FIGS. 2 and 3. FIG. 2 illustrates an example of a configuration of a trimming circuit. FIG. 2 illustrates a configuration of a conventional trimming circuit in which a state produced after a fuse is blown is not able to be checked before the fuse is blown.

A trimming circuit 20 includes a trimmed circuit 20a, resistors R20 to R22, fuses f20 to f22, buffers IC20 to IC22, and pads P0 to P2.

Components are connected as follows. A power supply VCC is connected to one ends of the resistors R20 to R22. The pad P0 is connected to the other end of the resistor R20, the input terminal of the buffer IC20, and one end of the fuse f20. The other end of the fuse f20 is connected to GND. The output terminal of the buffer IC20 is connected to a terminal, trim0, of the trimmed circuit 20a.

The pad P1 is connected to the other end of the resistor R21, the input terminal of the buffer IC21, and one end of the fuse f21. The other end of the fuse f21 is connected to GND. The output terminal of the buffer IC21 is connected to a terminal, trim1, of the trimmed circuit 20a.

The pad P2 is connected to the other end of the resistor R22, the input terminal of the buffer IC22, and one end of the fuse f22. The other end of the fuse f22 is connected to GND. The output terminal of the buffer IC22 is connected to a terminal, trim2, of the trimmed circuit 20a.

The relationship between resistance values of the resistors R20 to R22 and resistance values of the fuses f20 to f22 is that R20>>f20, R21>>f21, and R22>>f22. In the present specification, the symbol ">>" is given its ordinary meaning of "much greater than." For example, a resistance value of R20 may two or more times the resistance value of f20. In one embodiment, the resistance value of R20 is an order of magnitude greater than a resistance value of f20.

Here, suppose that an electrical characteristic value of the trimmed circuit 20a is out of specifications of the trimmed circuit 20a, and that the trimming data of [trim2, trim1, trim0]=[0, 0, 1] is used, according to design, to correct the trimmed circuit 20a.

In an initial state, because R20>>f20, R21>>f21, and R22>>f22, the nodes N0 to N2 are electrically continuous to GND and the output signals from the buffers IC20 to IC22 have a low (L) level of voltage. Thus, values in the bit width of the trimmed circuit 20a are [trim2, trim1, trim0]=[0, 0, 0].

When the trimming is performed, the pad P0 is applied with a voltage, and the fuse f20 is blown by the voltage. Then, only the output terminal of the buffer IC20 has a high (H) level of voltage because the node N0 is pulled up to the power supply VCC via the resistor R20. As a result, values in the bit width of the trimmed circuit 20a become [trim2, trim1, trim0]=[0, 0, 1], and thus the electrical characteristic value of the trimmed circuit 20a is corrected.

Figure 3:
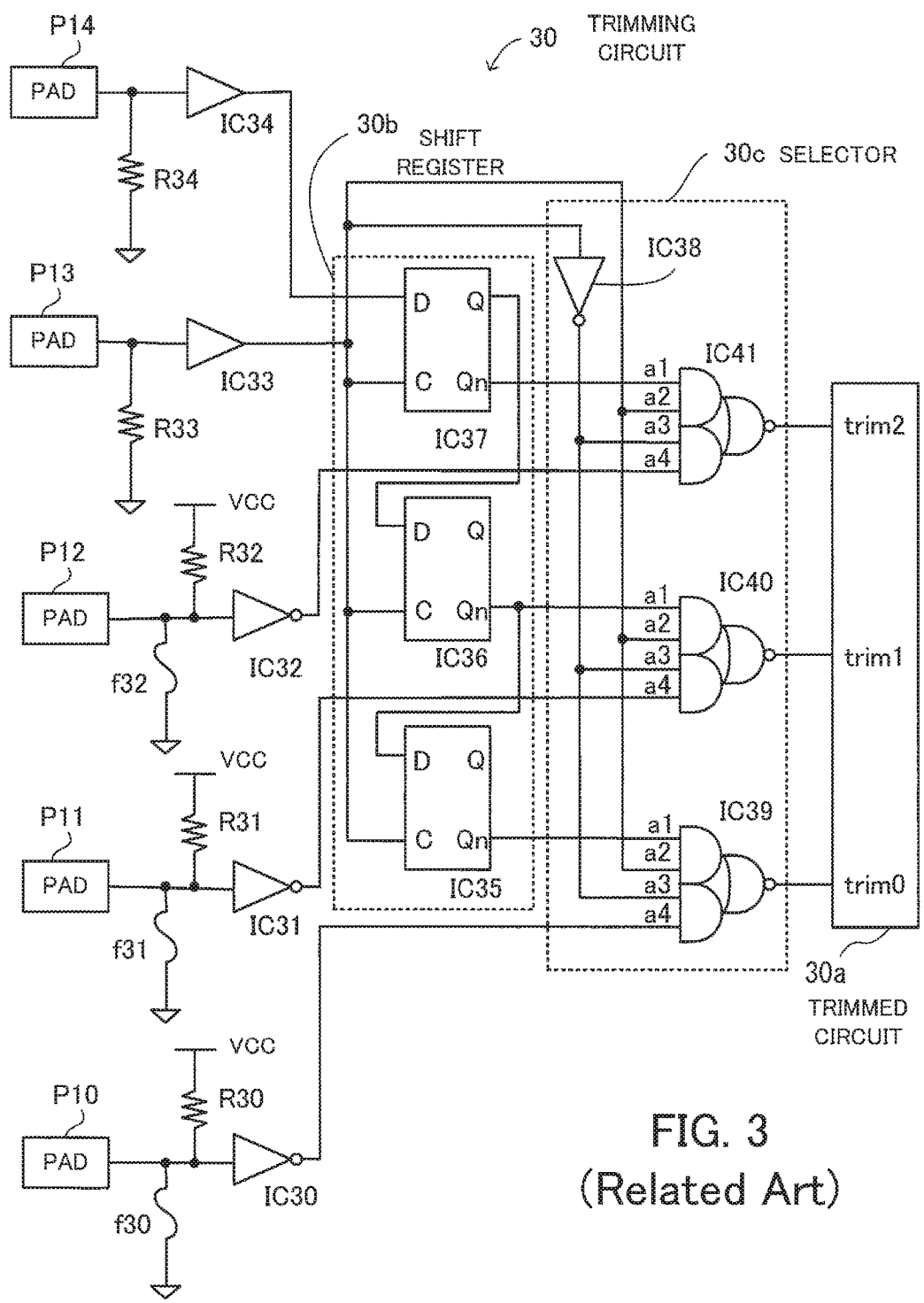
FIG. 3 illustrates an example of a configuration of a trimming circuit.

FIG. 3 illustrates an example of a configuration of a trimming circuit. FIG. 3 illustrates a configuration of the above-described conventional trimming circuit (see Japanese Laid-open Patent Publication No. 5-63090), in which a state produced after a fuse is blown is able to be checked before the fuse is blown.

A trimming circuit 30 includes a trimmed circuit 30a, resistors R30 to R34, fuses f30 to f32, inverters IC30 to IC32 and IC38, buffers IC33 and IC34, flip-flops IC35 to IC37, selector elements IC39 to IC41, and pads P10 to P14.

The flip-flops IC35 to IC37 constitute a shift register 30b; the inverter IC38 and the selector elements (complex gates) IC39 to IC41 constitute a selector 30c. Each of the selector elements IC39 to IC41 is constituted by two AND elements and one NOR element.

Components are connected as follows. The pad P10 is connected to one end of the fuse f30, one end of the resistor R30, and the input terminal of the inverter IC30. The other end of the fuse f30 is connected to GND. The other end of the resistor R30 is connected to a power supply VCC.

The pad P11 is connected to one end of the fuse f31, one end of the resistor R31, and the input terminal of the inverter IC31. The other end of the fuse f31 is connected to GND. The other end of the resistor R31 is connected to the power supply VCC.

The pad P12 is connected to one end of the fuse f32, one end of the resistor R32, and the input terminal of the inverter IC32. The other end of the fuse f32 is connected to GND. The other end of the resistor R32 is connected to the power supply VCC.

The pad P13 is connected to one end of the resistor R33 and the input terminal of the buffer IC33. The other end of the resistor R33 is connected to GND.

The pad P14 is connected to one end of the resistor R34 and the input terminal of the buffer IC34. The other end of the resistor R34 is connected to GND.

The output terminal of the inverter IC30 is connected to an input terminal a4 of the selector element IC39. The output terminal of the inverter IC31 is connected to an input terminal a4 of the selector element IC40. The output terminal of the inverter IC32 is connected to an input terminal a4 of the selector element IC41.

The output terminal of the buffer IC33 is connected to clock terminals C of the flip-flops IC35 to IC37, the input terminal of the inverter IC38, and input terminals a2 of the selector elements IC39 to IC41.

The output terminal of the buffer IC34 is connected to a data input terminal D of the flip-flop IC37. The output terminal of the inverter IC38 is connected to input terminals a3 of the selector elements IC39 to IC41.

An inversion output terminal Qn of the flip-flop IC35 is connected to an input terminal a1 of the selector element IC39. A data input terminal D of the flip-flop IC35 is connected to an inversion output terminal Qn of the flip-flop IC36 and an input terminal a1 of the selector element IC40.

A data input terminal D of the flip-flop IC36 is connected to an output terminal Q of the flip-flop IC37. An inversion output terminal Qn of the flip-flop IC37 is connected to an input terminal a1 of the selector element IC41. The output terminals of the selector elements IC39 to IC41 are respectively connected to terminals, trim0 to trim2, of the trimmed circuit 30a.

The trimming circuit 30 having such a configuration sends data into the shift register 30b by using a voltage of the pad P13 changed from the L level to the H level, causes the selector 30c to select output signals from the shift register 30b, and outputs the selected output signals to the trimmed circuit 30a. This allows a user to check a state of the trimmed circuit 30a produced after a fuse is blown, without blowing the fuse.

In the trimming circuit 20 illustrated in FIG. 2, a user is not able to check, before a fuse is blown, a state produced after the fuse is blown. This may cause reduction in yield, because an electrical characteristic value of the trimmed circuit is not always within specifications of the electrical characteristic value, after the fuse is blown.

By contrast, the trimming circuit 30 illustrated in FIG. 3 allows a user to check a state, in advance, produced after a fuse is blown. In such a circuit configuration, however, as the bit width of the trimmed circuit 30a increases, the number of selector elements in the selector 30c also increases, which increases the number of transistors. The increase of the number of transistors will increase the chip area.

The present embodiment is made in view of such problems, and provides the trimming device that improves yield and reduces the chip area even though the bit width to be set for the trimmed circuit is increased.

Second Embodiment

Next, a trimming device to which the trimming device 1-1 illustrated in FIG. 1 is embodied will be described in detail. Hereinafter, the description will be made for the case where the bit width of the trimmed circuit 10a is 3 bits. However, embodiments of the invention are not limited to a bit width of 3 bits. Any number of bits may be implemented.

Figure 4:
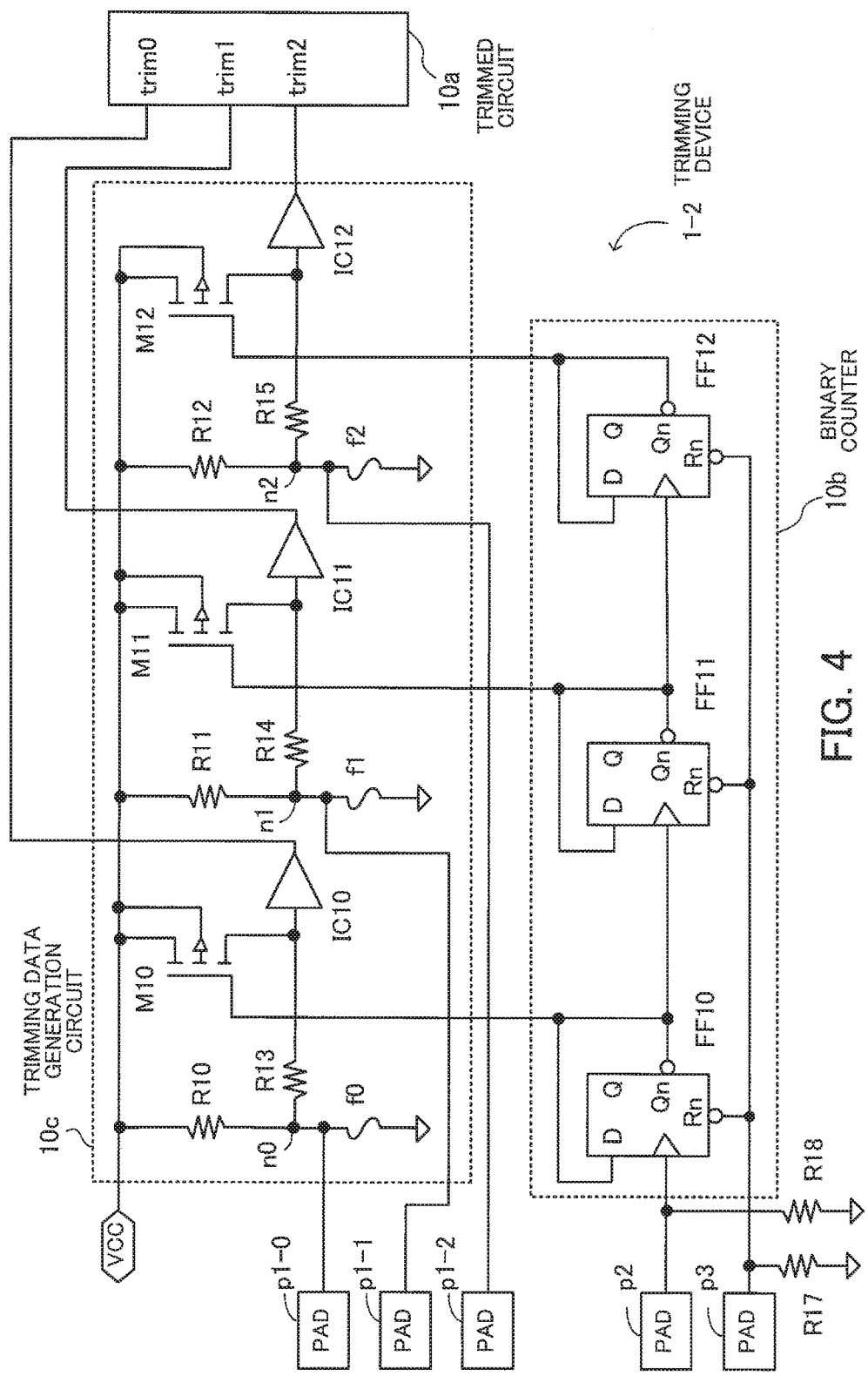
FIG. 4 illustrates an example of a configuration of a trimming device of a second embodiment.

FIG. 4 illustrates an example of a configuration of a trimming device 1-2 of a second embodiment. The trimming device 1-2 of the second embodiment is an example of a configuration in which the trimmed circuit 10a with the bit width of 3 bits (trim0 to trim2) is trimmed, and includes a binary counter 10b which serves as the counter circuit, and a trimming data generation circuit 10c.

The binary counter 10b includes flip-flops FF10 to FF12. The trimming data generation circuit 10c includes resistors R10 to R15, fuses f0 to f2, buffers IC10 to IC12, and transistors M10 to M12.

The relationship between resistance values of the resistors R10 to R12 and resistance values of the fuses f0 to f2 is that R10>>f0, R11>>f1, and R12>>f2.

Pads p1-0 to p1-2 are fuse-blowing-voltage applying pads (electrical-signal input pads). A pad p2 is a clock input pad used to input a clock signal to the binary counter 10b. A pad p3 is a reset input pad used to input a reset signal to the binary counter 10b. Each signal received by the pads p1-0 to p1-2 has a predetermined value which is set by a host device (such as a processor) (not illustrated).

The resistors R10 to R12 are pull-up resistors, and the resistors R13 to R15 are protective resistors used to prevent overvoltage from being applied to the buffers IC10 to IC12. A resistor R17 connected to a reset-signal input part of the binary counter 10b and a resistor R18 connected to a clock-signal input part of the binary counter 10b are pull-down resistors.

The flip-flops FF10 to FF12 are D-type flip-flops, and achieve a binary counter function. The transistors M10 to M12 used are P-channel metal oxide semiconductor (PMOS) transistors. Hereinafter, the transistors M10 to M12 are referred to as PMOS transistors M10 to M12.

Components are connected as follows. A power supply VCC (for example, 5V) is connected to one ends of the resistors R10 to R12, the sources of the PMOS transistors M10 to M12, and the back gates of the PMOS transistors M10 to M12.

The pad p1-0 is connected to the other end of the resistor R10, one end of the resistor R13, and one end of the fuse f0. The pad p1-1 is connected to the other end of the resistor R11, one end of the resistor R14, and one end of the fuse f1. The pad p1-2 is connected to the other end of the resistor R12, one end of the resistor R15, and one end of the fuse f2. The other ends of the fuses f0 to f2 are connected to GND.

The other end of the resistor R13 is connected to the drain of the PMOS transistor M10, and the input terminal of the buffer IC10. The other end of the resistor R14 is connected to the drain of the PMOS transistor M11, and the input terminal of the buffer IC11. The other end of the resistor R15 is connected to the drain of the PMOS transistor M12, and the input terminal of the buffer IC12.

The pad p2 is connected to one end of the resistor R18, and a clock terminal of the flip-flop FF10. The other end of the resistor R18 is connected to GND. The pad p3 is connected to one end of the resistor R17, and reset terminals Rn of the flip-flops FF10 to FF12. The other end of the resistor R17 is connected to GND.

A data input terminal D of the flip-flop FF10 is connected to the gate of the PMOS transistor M10, an inversion output terminal Qn of the flip-flop FF10, and a clock terminal of the flip-flop FF11.

A data input terminal D of the flip-flop FF11 is connected to the gate of the PMOS transistor M11, an inversion output terminal Qn of the flip-flop FF11, and a clock terminal of the flip-flop FF12.

A data input terminal D of the flip-flop FF12 is connected to the gate of the PMOS transistor M12, and an inversion output terminal Qn of the flip-flop FF12.

Next, an operation of the trimming device 1-2 will be described. The trimming device 1-2 has three operation phases: a trimming check phase, a fuse blowing phase, and an actual operation phase.

The trimming check phase is a phase to check a state produced after a fuse is blown, before the fuse is actually blown. The fuse blowing phase is a phase to blow a predetermined fuse. The actual operation phase is a phase to operate the trimmed circuit in a state where the predetermined fuse has been blown and the trimming has been performed in the fuse blowing phase. Hereinafter, each of the operation phases will be described.

(Trimming Check Phase)

When the power is supplied, the trimming device 1-2 is active (in a reset state) because the reset terminals are pulled down. Thus, the flip-flops FF10 to FF12 that constitute the binary counter 10b are in a reset state, and all of Qn output signals (i.e. output signals from the inversion output terminals Qn) have a high potential level (hereinafter, H level) (the setting data has a second level).

In this state, the reset signal is then turned to the H level via the pad p3 to release the reset state, and the clock signal is inputted to the clock terminal of the flip-flop FF10 via the pad p2. Then, the binary counter 10b is incremented by one in binary every time the clock signal rises. The binary counter 10b starts counting with the Qn output signals of [0, 0, 0], and outputs the Qn output signals of [1, 1, 1] when seven clocks of the clock signal are inputted to the binary counter 10b.

When a Qn output signal of any of the flip-flops FF10 to FF12 has a low potential level (hereinafter, L level) (i.e. when the setting data has a first level), a corresponding PMOS transistor connected to the flip-flop whose Qn output signal has the L level is turned on to produce the same state as a state where a target fuse is blown.

In this manner, the output value from the binary counter 10b varies from [0, 0, 0] to [1, 1, 1], and thus operations in all combinations of the fuses f0 to f2 to be blown are able to be checked. If an operation in only a certain combination is checked, the clock signal is inputted until the certain combination is obtained.

Here, an operation in the trimming check phase, in which trimming data is generated in accordance with the count function of the binary counter 10b, will be described using a timing chart.

Figure 5:
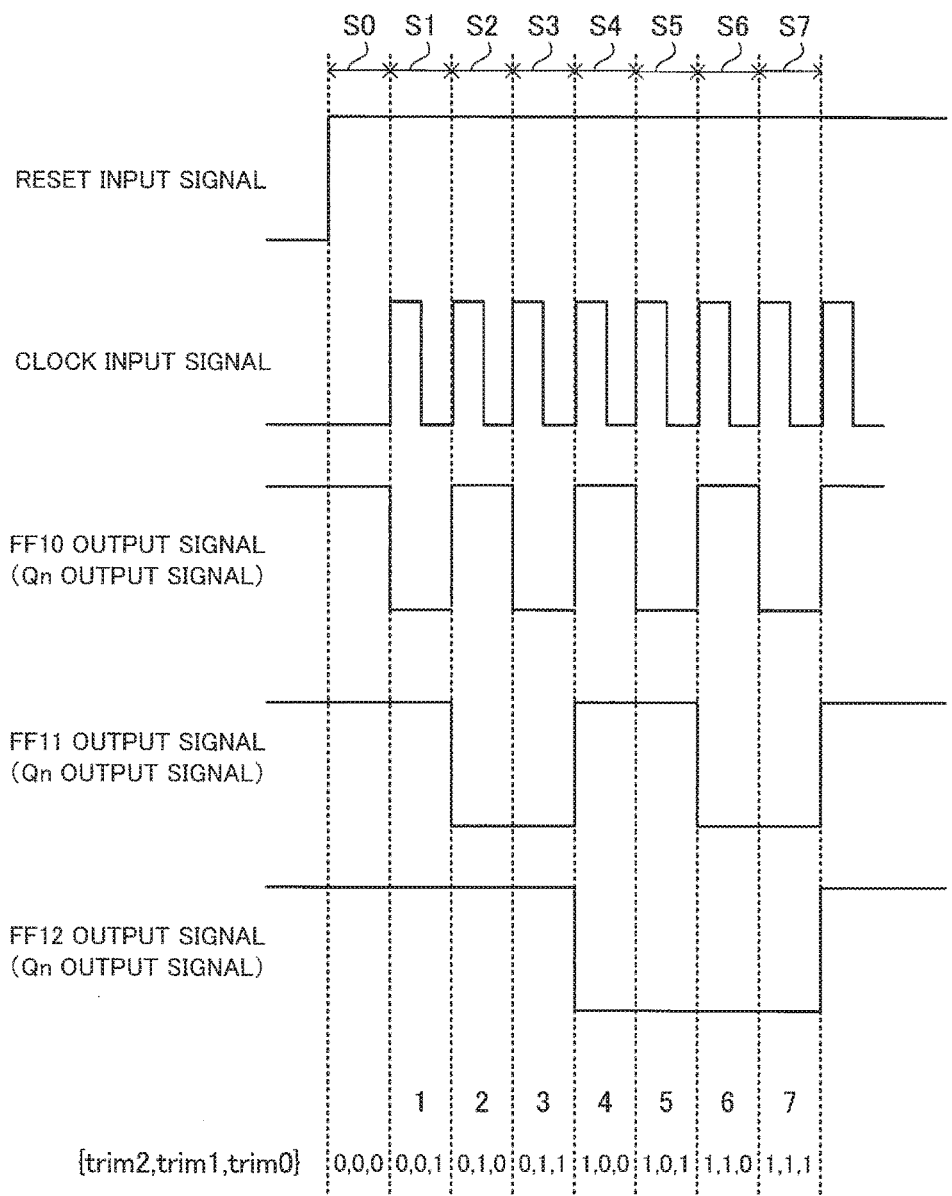
FIG. 5 is a timing chart illustrating an operation for generating trimming data.

FIG. 5 is the timing chart illustrating the operation for generating trimming data.

[S0] The reset state is released, but the clock signal is not inputted and the clock terminal of the flip-flop FF10 has the L level. Thus, the Qn output signals of the flip-flops FF10 to FF12 have the H level.

At this time, the PMOS transistors M10 to M12 are turned off. Thus, the buffers IC10 to IC12 output the L level signal.

As a result, the trimming data inputted to the trimmed circuit 10a is [trim2, trim1, trim0]=[0, 0, 0].

In the following steps S1 to S7, the clock signal is inputted to the clock terminal of the flip-flop FF10 from the pad p2, while the reset state of the flip-flops FF10 to FF12 is released.

[S1] In the period of the first clock of the clock signal, the inversion output terminal Qn of the flip-flop FF10 outputs the L level signal, the inversion output terminal Qn of the flip-flop FF11 outputs the H level signal, and the inversion output terminal Qn of the flip-flop FF12 outputs the H level signal.

At this time, the PMOS transistor M10 is turned on, the PMOS transistor M11 is turned off, and the PMOS transistor M12 is turned off. Thus, the buffer IC10 outputs the H level signal, the buffer IC11 outputs the L level signal, and the buffer IC12 outputs the L level signal.

As a result, the trimming data inputted to the trimmed circuit 10a is [trim2, trim1, trim0]=[0, 0, 1].

[S2] In the period of the second clock of the clock signal, the inversion output terminal Qn of the flip-flop FF10 outputs the H level signal, the inversion output terminal Qn of the flip-flop FF11 outputs the L level signal, and the inversion output terminal Qn of the flip-flop FF12 outputs the H level signal.

At this time, the PMOS transistor M10 is turned off, the PMOS transistor M11 is turned on, and the PMOS transistor M12 is turned off. Thus, the buffer IC10 outputs the L level signal, the buffer IC11 outputs the H level signal, and the buffer IC12 outputs the L level signal. As a result, the trimming data is [trim2, trim1, trim0]=[0, 1, 0].

[S3] In the period of the third clock of the clock signal, the inversion output terminal Qn of the flip-flop FF10 outputs the L level signal, the inversion output terminal Qn of the flip-flop FF11 outputs the L level signal, and the inversion output terminal Qn of the flip-flop FF12 outputs the H level signal.

At this time, the PMOS transistor M10 is turned on, the PMOS transistor M11 is turned on, and the PMOS transistor M12 is turned off. Thus, the buffer IC10 outputs the H level signal, the buffer IC11 outputs the H level signal, and the buffer IC12 outputs the L level signal. As a result, the trimming data inputted to the trimmed circuit 10a is [trim2, trim1, trim0]=[0, 1, 1].

[S4] In the period of the fourth clock of the clock signal, the inversion output terminal Qn of the flip-flop FF10 outputs the H level signal, the inversion output terminal Qn of the flip-flop FF11 outputs the H level signal, and the inversion output terminal Qn of the flip-flop FF12 outputs the L level signal.

At this time, the PMOS transistor M10 is turned off, the PMOS transistor M11 is turned off, and the PMOS transistor M12 is turned on. Thus, the buffer IC10 outputs the L level signal, the buffer IC11 outputs the L level signal, and the buffer IC12 outputs the H level signal. As a result, the trimming data inputted to the trimmed circuit 10a is [trim2, trim1, trim0]=[1, 0, 0].

[S5] In the period of the fifth clock of the clock signal, the inversion output terminal Qn of the flip-flop FF10 outputs the L level signal, the inversion output terminal Qn of the flip-flop FF11 outputs the H level signal, and the inversion output terminal Qn of the flip-flop FF12 outputs the L level signal.

At this time, the PMOS transistor M10 is turned on, the PMOS transistor M11 is turned off, and the PMOS transistor M12 is turned on. Thus, the buffer IC10 outputs the H level signal, the buffer IC11 outputs the L level signal, and the buffer IC12 outputs the H level signal. As a result, the trimming data inputted to the trimmed circuit 10a is [trim2, trim1, trim0]=[1, 0, 1].

[S6] In the period of the sixth clock of the clock signal, the inversion output terminal Qn of the flip-flop FF10 outputs the H level signal, the inversion output terminal Qn of the flip-flop FF11 outputs the L level signal, and the inversion output terminal Qn of the flip-flop FF12 outputs the L level signal.

At this time, the PMOS transistor M10 is turned off, the PMOS transistor M11 is turned on, and the PMOS transistor M12 is turned on. Thus, the buffer IC10 outputs the L level signal, the buffer IC11 outputs the H level signal, and the buffer IC12 outputs the H level signal. As a result, the trimming data inputted to the trimmed circuit 10a is [trim2, trim1, trim0]=[1, 1, 0].

[S7] In the period of the seventh clock of the clock signal, the inversion output terminal Qn of the flip-flop FF10 outputs the L level signal, the inversion output terminal Qn of the flip-flop FF11 outputs the L level signal, and the inversion output terminal Qn of the flip-flop FF12 outputs the L level signal.

At this time, the PMOS transistors M10 to M12 are turned on. Thus, the buffers IC10 to IC12 output the H level signal. As a result, the trimming data inputted to the trimmed circuit 10a is [trim2, trim1, trim0]=[1, 1, 1].

Thus, when any of the inversion output signals (Qn output signals) of the flip-flops FF10 to FF12, which constitute the binary counter 10b, has the L level, a corresponding one of the PMOS transistors M10 to M12 used to check the trimming is turned on.

When any of the PMOS transistors M10 to M12 is turned on, a corresponding one of the buffers IC10 to IC12 outputs the H level signal (by contrast, when any of the PMOS transistors M10 to M12 is turned off, a corresponding one of the buffers IC10 to IC12 outputs the L level signal), and produces the same state as a state where a corresponding one of the fuses f0 to f2 is blown.

With this operation, an optimum combination of the values (trim0 to trim2) in the bit width of the trimmed circuit 10a is found in advance. Here, the optimum combination is a combination in which a state produced after a fuse is blown is checked before the fuse is blown.

In addition, the use of the binary counter 10b in the counter circuit 1b reduces the number of transistors of the trimming device, and also reduces the number of clocks used to find the combination of fuses to be blown. For example, in the case where 3 bits are used, all combinations are found with 7 clocks (but if a shift register is used, 21 clocks (21 clocks=3 clocks×7 combinations) are used).

(Fuse Blowing Phase)

By using the combination of the fuses f0 to f2 to be blown that is found in the trimming check phase, a target fuse of the fuses f0 to f2 is actually blown. For example, suppose that an electrical characteristic value of the trimmed circuit 10a becomes optimum when the second clock of the clock signal is inputted.

In this case, the bit value of the trimming data is [trim2, trim1, trim0]=[0, 1, 0]. Consequently, the fuse f1 is blown by applying a predetermined voltage to the pad p1-1 or by flowing a predetermined current through the pad p1-1. In the fuse blowing phase, the binary counter 10b is in the reset state.

(Actual Operation Phase)

Because the reset terminal and the clock terminal of the binary counter 10b are, respectively, pulled down by the resistor R17 and the resistor R18, the flip-flops FF10 to FF12 are in the reset state, and thus all the Qn output signals have the H level.

As a result, the PMOS transistors M10 to M12 are not turned on, and thus voltages at nodes in a state where the target fuse has been blown in the fuse blowing phase are directly outputted to the trimmed circuit 10a. This allows the trimmed circuit 10a to operate in its optimum condition.

Figure 6:
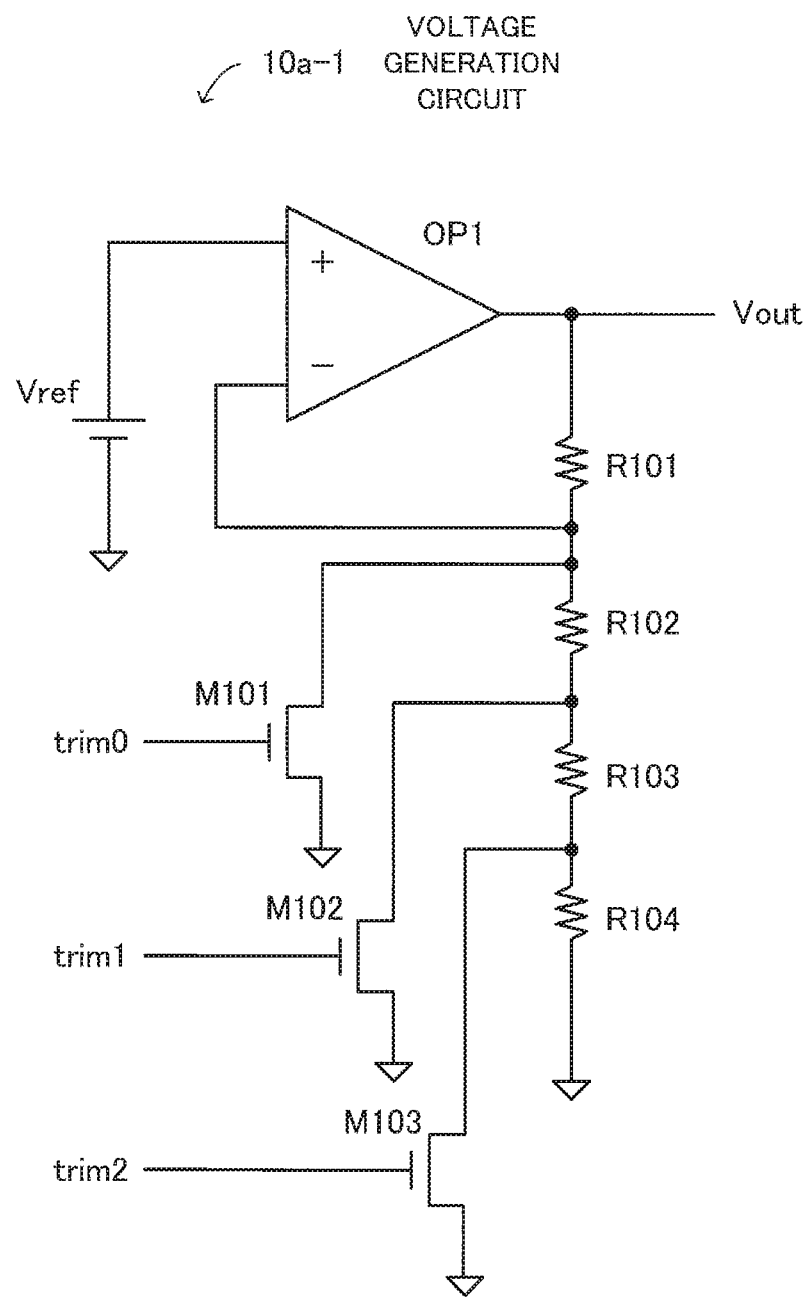
FIG. 6 illustrates one example of a trimmed circuit.

Next, one specific example of the trimmed circuit 10a will be described. FIG. 6 illustrates one example of the trimmed circuit. For example, a voltage generation circuit 10a-1 is appropriately used as the trimmed circuit 10a.

The voltage generation circuit 10a-1 includes an operational amplifier OP1, a reference voltage source Vref, resistors R101 to R104, and N-channel MOS (NMOS) transistors M101 to M103.

The positive input terminal of the operational amplifier OP1 is connected to the positive terminal of the reference voltage source Vref. The negative terminal of the reference voltage source Vref is connected to GND. The output terminal of the operational amplifier OP1 is connected to one end of the resistor R101.

The negative input terminal of the operational amplifier OP1 is connected to the other end of the resistor R101, one end of the resistor R102, and the drain of the NMOS transistor M101. The other end of the resistor R102 is connected to one end of the resistor R103, and the drain of the NMOS transistor M102. The other end of the resistor R103 is connected to one end of the resistor R104, and the drain of the NMOS transistor M103. The other end of the resistor R104 is connected to GND.

The gate of the NMOS transistor M101 receives the trimming data trim0. The gate of the NMOS transistor M102 receives the trimming data trim1. The gate of the NMOS transistor M103 receives the trimming data trim2. The sources of the NMOS transistors M101 to M103 are connected to GND.

In such a configuration, an output voltage Vout of the voltage generation circuit 10a-1 is trimmed in accordance with a value which is set in the trimming data [trim2, trim1, trim0].

As an example, when the trimming data [trim2, trim1, trim0]=[0, 0, 0], the NMOS transistors M101 to M103 are turned off. As a result, the negative input terminal of the operational amplifier OP1 receives an input voltage, into which the output voltage Vout is divided by the resistor R101 and the series-combined resistors R102 to R104, and a difference voltage between the input voltage and a voltage generated by the reference voltage source Vref is outputted from the operational amplifier OP1.

As another example, when the trimming data [trim2, trim1, trim0]=[0, 1, 0], only the NMOS transistor M102 is turned on. As a result, the negative input terminal of the operational amplifier OP1 receives an input voltage, into which the output voltage Vout is divided by the resistor R101 and the resistor R102, and a difference voltage between the input voltage and the voltage generated by the reference voltage source Vref is outputted from the operational amplifier OP1. In such a manner, the output voltage Vout from the operational amplifier OP1 is adjusted and optimized by changing the value of the trimming data.

Next, advantageous effects of the present embodiment will be described, with the trimming device 1-2 of the present embodiment compared with the conventional arts. FIG. 7 illustrates a comparison result on operation check before fuse blowing, and on the number of transistors used. A table T1 tabulates contents on an item "operation check before fuse blowing" and on an item "the number of transistors used", for each bit width of the trimmed circuit. In FIG. 7, the bit width of the trimmed circuit is 4 to 7 bits, for example.

If the "operation check before fuse blowing" is impossible, it means that a state produced after a fuse is blown is not able to be checked before the fuse is blown. If the "operation check before fuse blowing" is possible, it means that a state produced after a fuse is blown is able to be checked before the fuse is blown.

In the trimming circuit 20 illustrated in FIG. 2, the "operation check before fuse blowing" is impossible. In the trimming circuit 30 illustrated in FIG. 3, the "operation check before fuse blowing" is possible, but "the number of transistors used" increases as the bit width of the trimmed circuit increases.

For example, if one AND element has 6 transistors and one NOR element has 4 transistors, then one complex gate of the selector 30c of the trimming circuit 30 illustrated in FIG. 3 has 16 transistors. Also, suppose that one inverter has 2 transistors.

As a result, in the trimming circuit 30, if the bit width of the trimmed circuit is 4 bits, then "the number of transistors used" is 74 (74=16×4+2×5). If the bit width of the trimmed circuit is 5 bits, then "the number of transistors used" is 92 (92=16×5+2×6).

Similarly, if the bit width of the trimmed circuit is 6 bits, then "the number of transistors used" is 110 (110=16×6+2×7); if the bit width of the trimmed circuit is 7 bits, then "the number of transistors used" is 128 (128=16×7+2×8).

By contrast, in the trimming device 1-2 of the present embodiment that is illustrated in FIG. 4, the "operation check before fuse blowing" is possible, and "the number of transistors used" is smaller than that of the trimming circuit 30.

In the trimming device 1-2, when the bit width of the trimmed circuit is n bits, "the number of transistors used" is n (that is, the bit width of trimmed circuit is equal to the number of PMOS transistors of the trimming data generation circuit 10c). Thus, it can be seen that the number of transistors is reduced.

FIG. 8 illustrates a comparison result on advantageous effects. A table T2 tabulates compared circuits, advantageous effects over the compared circuits, and reasons of the advantageous effects. In comparison with the trimming circuit 20, the trimming device 1-2 improves yield. The reason is that the trimming device 1-2 allows a user to check a state produced after a fuse is blown, before the fuse is blown.

In comparison with the trimming circuit 30, chip cost of the trimming device 1-2 becomes lower, regardless of the bit width of the trimmed circuit. The reason is that the number of transistors in the trimming device 1-2 is reduced, regardless of the bit width of the trimmed circuit, which reduces the chip area of the trimming device 1-2.

Third Embodiment

Next, a third embodiment will be described. In the third embodiment, an electrical characteristic value of the trimmed circuit 10a is monitored by using the trimming data given in the trimming check phase. When the electrical characteristic value reaches a predetermined electrical characteristic value (target value), a fuse blowing signal is outputted to automatically blow a target fuse. Here, the fuse blowing signal is based on a bit value of the trimming data obtained when the electrical characteristic value reaches the target value.

Figure 9:
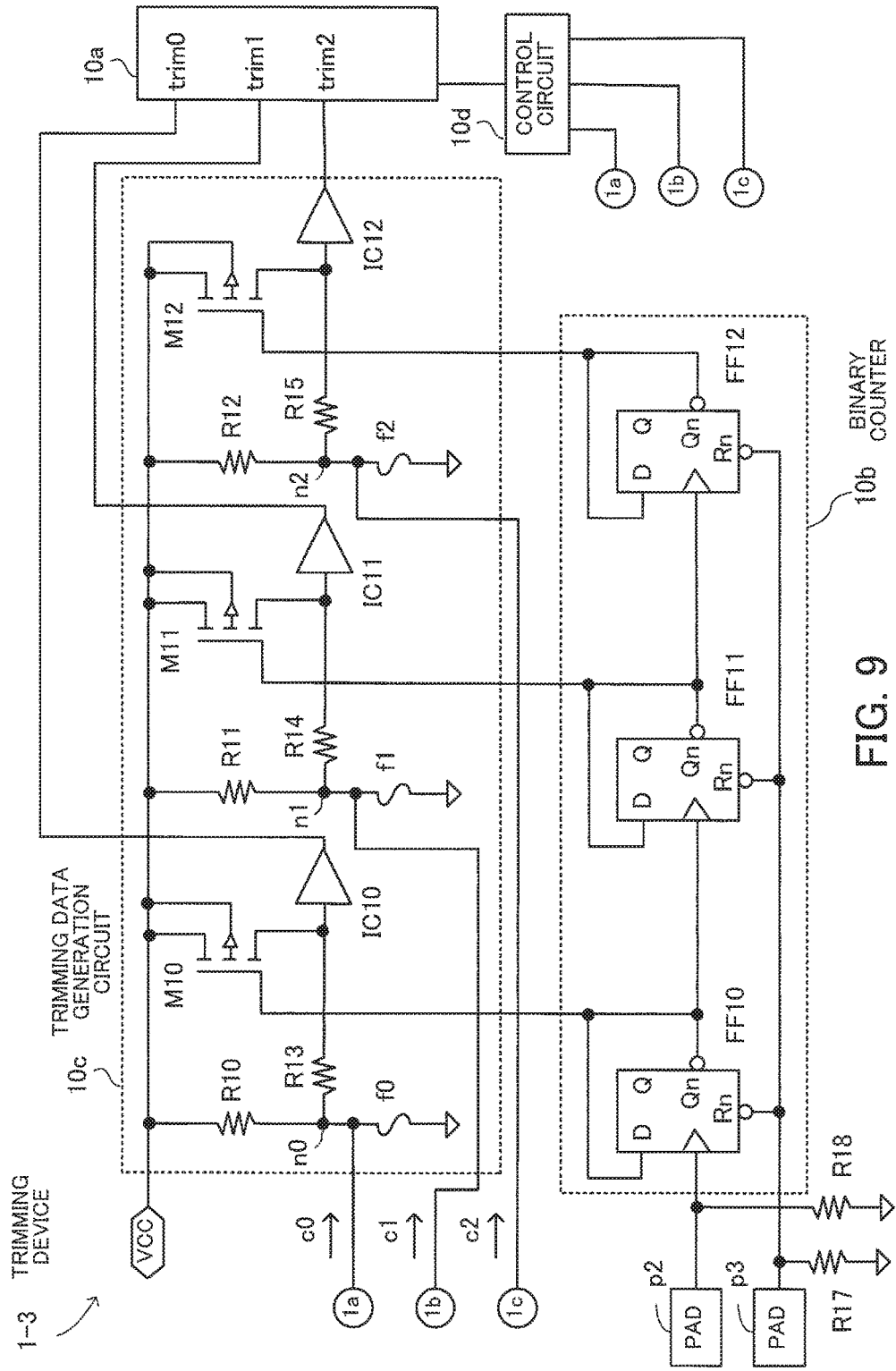
FIG. 9 illustrates an example of a configuration of a trimming device of a third embodiment.

FIG. 9 illustrates an example of a configuration of a trimming device of the third embodiment. The trimming device 1-3 is provided with a control circuit 10d, as a new circuit, in addition to the trimming device 1-2 illustrated in FIG. 4. The circuit configuration other than the control circuit 10d is the same.

An operation of the control circuit 10d will be described. The control circuit 10d monitors an electrical characteristic value of the trimmed circuit 10a when the trimming data, generated in accordance with the count operation of the binary counter 10b, is given to the trimmed circuit 10a.

When the control circuit 10d determines that the electrical characteristic value of the trimmed circuit 10a reaches a predetermined target value, the control circuit 10d detects the trimming data given when the electrical characteristic value reaches the target value, and outputs fuse blowing signals (electrical signals), c0 to c2, in accordance with a bit value of the trimming data detected.

For example, suppose that the bit value of the trimming data given when the electrical characteristic value of the trimmed circuit 10a reaches the target value is monitored as [trim2, trim1, trim0]=[0, 1, 0].

In this case, the control circuit 10d causes only the fuse blowing signal c1 to be a high voltage signal in accordance with the bit value of the trimming data, which is a result of the monitoring, and applies the fuse blowing signal c1 into the trimming data generation circuit 10c to blow the fuse f1.

Thus, in the third embodiment, the electrical characteristic value of the trimmed circuit 10a is monitored by using the trimming data, and the fuse blowing signal used to blow a target fuse is outputted when the electrical characteristic value reaches a target value. With this configuration, the blowing of the target fuse is automatically performed.

Fourth Embodiment

Next, a fourth embodiment will be described. In the configuration of the above-described trimming device, the binary counter is used as the counter circuit. In the fourth embodiment, a shift register is used as the counter circuit.

Figure 10:
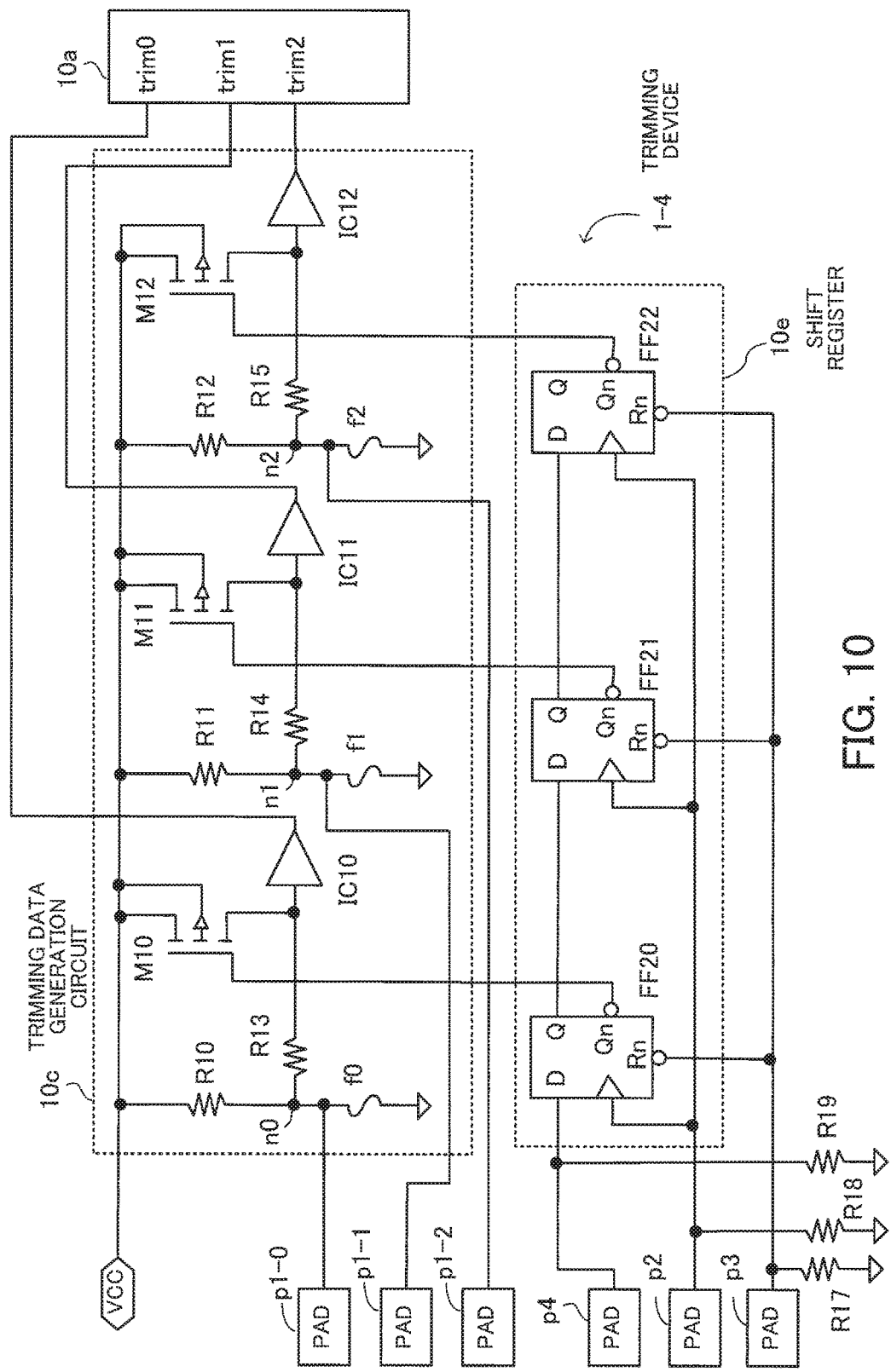
FIG. 10 illustrates an example of a configuration of a trimming device of a fourth embodiment.

FIG. 10 illustrates an example of a configuration of a trimming device of the fourth embodiment. The trimming device 1-4 of the fourth embodiment includes the trimmed circuit 10a with the bit width of 3 bits (trim0 to trim2), a shift register 10e which serves as the counter circuit, and the trimming data generation circuit 10c.

Hereinafter, the description will be made for a configuration which is different from the configuration illustrated in FIG. 4. The shift register 10e includes flip-flops FF20 to FF22. The flip-flops FF20 to FF22 are D-type flip-flops, and achieve a shift register function.

Also, the trimming device 1-4 is provided with an additional resistor R19, which serves as a resistive element, and an additional pad p4. The pad p4 is a data input pad used to input shift register data into the shift register 10e.

Components of the shift register 10e are connected as follows. The pad p2 that serves as the clock input pad is connected to one end of the resistor R18, and clock terminals of the flip-flops F20 to F22. The other end of the resistor R18 is connected to GND. The pad p3 that serves as the reset input pad is connected to one end of the resistor R17, and reset terminals Rn of the flip-flops FF20 to FF22. The other end of the resistor R17 is connected to GND.

The pad p4 that serves as the data input pad is connected to a data input terminal D of the flip-flop FF20, and one end of the resistor R19. The other end of the resistor R19 is connected to GND. The inversion output terminal Qn of the flip-flop FF20 is connected to the gate of the PMOS transistor M10. The inversion output terminal Qn of the flip-flop FF21 is connected to the gate of the PMOS transistor M11. The inversion output terminal Qn of the flip-flop FF22 is connected to the gate of the PMOS transistor M12.

Figure 11:
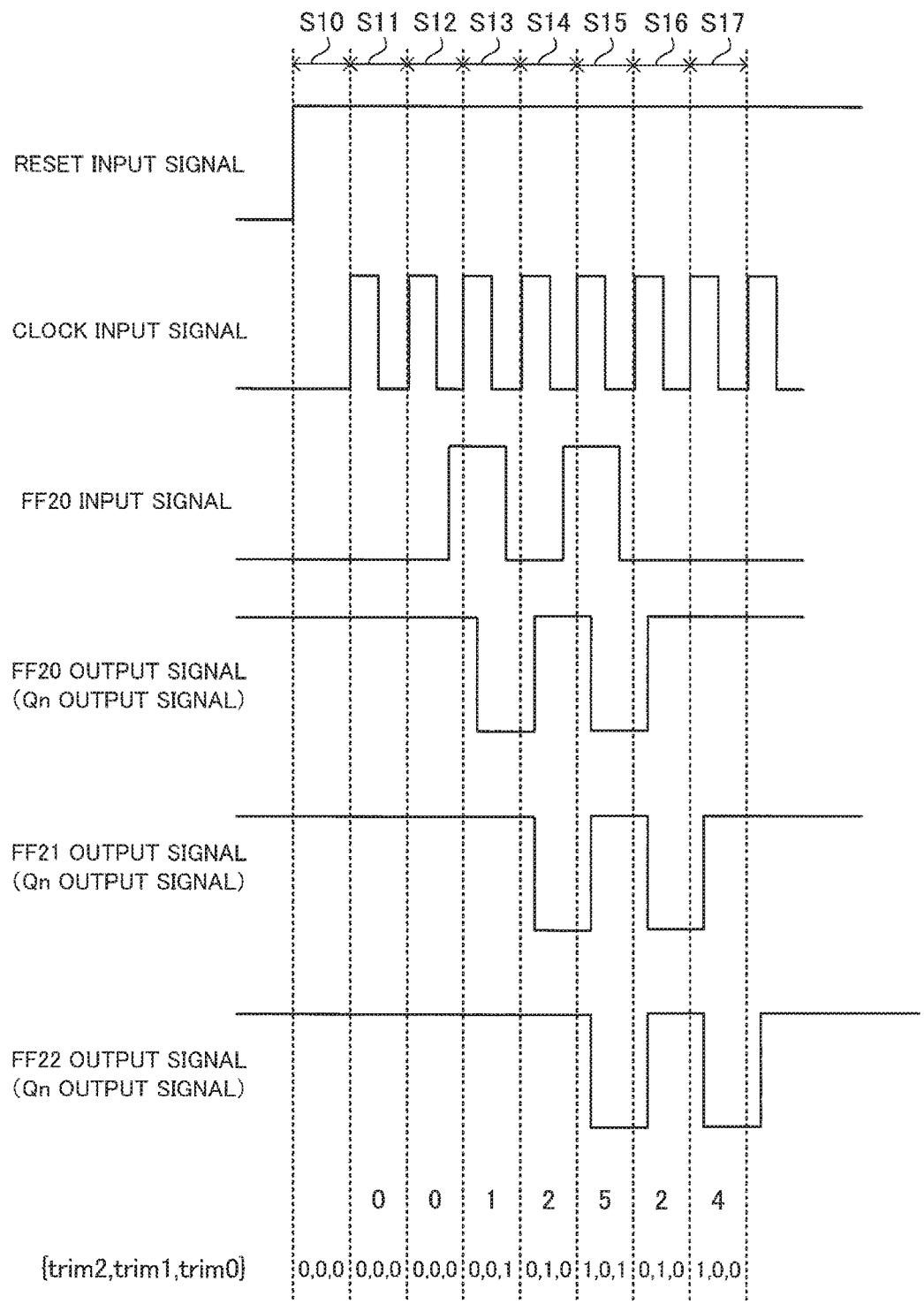
FIG. 11 is a timing chart illustrating an operation for generating trimming data.

FIG. 11 is a timing chart illustrating an operation for generating trimming data in accordance with the count function of the shift register 10e.

[S10] The reset state is released, but the clock signal is not inputted and the clock terminals have the L level. At this time, the input signal (i.e. shift register data) to the flip-flop FF20 also has the L level. Thus, the Qn output signals of the flip-flops FF20 to FF22 have the H level.

At this time, because the PMOS transistors M10 to M12 are turned off, the buffers IC10 to IC12 output the L level signals.

As a result, the trimming data inputted to the trimmed circuit 10a is [trim2, trim1, trim0]=[0, 0, 0].

In the following steps S11 to S17, the clock signal is inputted to the clock terminals of the flip-flops FF20 to FF22 from the pad p2 and the shift register data is inputted to the data input terminal D of the flip-flop FF20 from the pad p4, while the reset state of the flip-flops FF20 to FF22 is released.

[S11] In the period of the first clock of the clock signal, when the clock signal rises, the input terminal of the flip-flop FF20 has the L level and the inversion output terminals Qn of the flip-flops FF20 to FF21 have the H level.

At this time, the PMOS transistors M10 to M12 are turned off. Thus, the buffers IC10 to IC12 output the L level signal. As a result, the trimming data inputted to the trimmed circuit 10a is [trim2, trim1, trim0]=[0, 0, 0].

[S12] In the period of the second clock of the clock signal, when the clock signal rises, the input terminal of the flip-flop FF20 has the L level and the inversion output terminals Qn of the flip-flops FF20 to FF21 have the H level. As a result, the trimming data inputted to the trimmed circuit 10a remains [trim2, trim1, trim0]=[0, 0, 0].

[S13] In the period of the third clock of the clock signal, when the clock signal rises, the input terminal of the flip-flop FF20 has the H level. Then, the level of the inversion output terminal Qn of the flip-flop FF20 changes from the H level to the L level.

The inversion output terminal Qn of the flip-flop FF21 outputs the H level signal, because the level of the inversion output terminal Qn of the flip-flop FF21 becomes equal to the level of the inversion output terminal Qn of the flip-flop FF20, which is latched by the flip-flop FF20 at the second clock prior to the third clock of the clock signal.

The inversion output terminal Qn of the flip-flop FF22 outputs the H level signal, because the level of the inversion output terminal Qn of the flip-flop FF22 becomes equal to the level of the inversion output terminal Qn of the flip-flop FF21, which is latched by the flip-flop FF21 at the second clock prior to the third clock of the clock signal.

At this time, the PMOS transistor M10 is turned on, the PMOS transistor M11 is turned off, and the PMOS transistor M12 is turned off. Thus, the buffer IC11 outputs the H level signal, the buffer IC12 outputs the L level signal, and the buffer IC13 outputs the L level signal.

As a result, the trimming data inputted to the trimmed circuit 10a is [trim2, trim1, trim0]=[0, 0, 1].

[S14] In the period of the fourth clock of the clock signal, when the clock signal rises, the input terminal of the flip-flop FF20 has the L level, and thus the level of the inversion output terminal Qn of the flip-flop FF20 changes from the L level to the H level.

The level of the inversion output terminal Qn of the flip-flop FF21 changes from the H level to the L level, because the level of the inversion output terminal Qn of the flip-flop FF21 becomes equal to the level of the inversion output terminal Qn of the flip-flop FF20, which is latched by the flip-flop FF20 at the third clock prior to the fourth clock of the clock signal.

The inversion output terminal Qn of the flip-flop FF22 outputs the H level signal, because the level of the inversion output terminal Qn of the flip-flop FF22 becomes equal to the level of the inversion output terminal Qn of the flip-flop FF21, which is latched by the flip-flop FF21 at the third clock prior to the fourth clock of the clock signal.

At this time, the PMOS transistor M10 is turned off, the PMOS transistor M11 is turned on, and the PMOS transistor M12 is turned off. Thus, the buffer IC11 outputs the L level signal, the buffer IC12 outputs the H level signal, and the buffer IC13 outputs the L level signal. As a result, the trimming data inputted to the trimmed circuit 10a is [trim2, trim1, trim0]=[0, 1, 0].

[S15] In the period of the fifth clock of the clock signal, when the clock signal rises, the input terminal of the flip-flop FF20 has the H level, and thus the level of the inversion output terminal Qn of the flip-flop FF20 changes from the H level to the L level.

The level of the inversion output terminal Qn of the flip-flop FF21 changes from the L level to the H level, because the level of the inversion output terminal Qn of the flip-flop FF21 becomes equal to the level of the inversion output terminal Qn of the flip-flop FF20, which is latched by the flip-flop FF20 at the fourth clock prior to the fifth clock of the clock signal.

The level of the inversion output terminal Qn of the flip-flop FF22 changes from the H level to the L level, because the level of the inversion output terminal Qn of the flip-flop FF22 becomes equal to the level of the inversion output terminal Qn of the flip-flop FF21, which is latched by the flip-flop FF21 at the fourth clock prior to the fifth clock of the clock signal.

At this time, the PMOS transistor M10 is turned on, the PMOS transistor M11 is turned off, and the PMOS transistor M12 is turned on. Thus, the buffer IC11 outputs the H level signal, the buffer IC12 outputs the L level signal, and the buffer IC13 outputs the H level signal. As a result, the trimming data inputted to the trimmed circuit 10a is [trim2, trim1, trim0]=[1, 0, 1].

[S16] In the period of the sixth clock of the clock signal, when the clock signal rises, the input terminal of the flip-flop FF20 has the L level, and thus the level of the inversion output terminal Qn of the flip-flop FF20 changes from the L level to the H level.

The level of the inversion output terminal Qn of the flip-flop FF21 changes from the H level to the L level, because the level of the inversion output terminal Qn of the flip-flop FF21 becomes equal to the level of the inversion output terminal Qn of the flip-flop FF20, which is latched by the flip-flop FF20 at the fifth clock prior to the sixth clock of the clock signal.

The level of the inversion output terminal Qn of the flip-flop FF22 changes from the L level to the H level, because the level of the inversion output terminal Qn of the flip-flop FF22 becomes equal to the level of the inversion output terminal Qn of the flip-flop FF21, which is latched by the flip-flop FF21 at the fifth clock prior to the sixth clock of the clock signal.

At this time, the PMOS transistor M10 is turned off, the PMOS transistor M11 is turned on, and the PMOS transistor M12 is turned off. Thus, the buffer IC11 outputs the L level signal, the buffer IC12 outputs the H level signal, and the buffer IC13 outputs the L level signal. As a result, the trimming data inputted to the trimmed circuit 10a is [trim2, trim1, trim0]=[0, 1, 0].

[S17] In the period of the seventh clock of the clock signal, when the clock signal rises, the input terminal of the flip-flop FF20 has the L level, and thus the inversion output terminal Qn of the flip-flop FF20 outputs the H level signal.

The level of the inversion output terminal Qn of the flip-flop FF21 changes from the L level to the H level, because the level of the inversion output terminal Qn of the flip-flop FF21 becomes equal to the level of the inversion output terminal Qn of the flip-flop FF20, which is latched by the flip-flop FF20 at the sixth clock prior to the seventh clock of the clock signal.

The level of the inversion output terminal Qn of the flip-flop FF22 changes from the H level to the L level, because the level of the inversion output terminal Qn of the flip-flop FF22 becomes equal to the level of the inversion output terminal Qn of the flip-flop FF21, which is latched by the flip-flop FF21 at the sixth clock prior to the seventh clock of the clock signal.

At this time, the PMOS transistor M10 is turned off, the PMOS transistor M11 is turned off, and the PMOS transistor M12 is turned on. Thus, the buffer IC11 outputs the L level signal, the buffer IC12 outputs the L level signal, and the buffer IC13 outputs the H level signal. As a result, the trimming data inputted to the trimmed circuit 10a is [trim2, trim1, trim0]=[1, 0, 0].

In this manner, when any of the inversion output signals (Qn output signals) of the flip-flops FF20 to FF22, which constitute the shift register 10e, has the L level, a corresponding one of the PMOS transistors M10 to M12 used to check the trimming is turned on.

Then, when the corresponding one of the PMOS transistors M10 to M12 is turned on, a corresponding one of the buffers IC10 to IC12 outputs the H level signal (by contrast, when any of the PMOS transistors M10 to M12 is turned off, a corresponding one of the buffers IC10 to IC12 outputs the L level signal), and produces the same state as a state where a corresponding one of the fuses f0 to f2 is blown.

The trimming device 1-4 with the above-described configuration also improves yield, and reduces the number of transistors of the trimming device 1-4, regardless of the bit width of the trimmed circuit, which reduces the chip area of the trimming device 1-4.

The embodiments have been described as examples in the above. The configuration of each part of an embodiment may be replaced by another configuration having a similar function. Also, any other configuration or process may be added to an embodiment.

In one aspect, the yield is improved and the chip area is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A trimming device for adjusting an electrical characteristic value of a trimmed circuit, the trimming device comprising:
   a counter circuit configured to generate n-bit setting data for n-bit trimming data used to trim the trimmed circuit, where n is three or more; and
   a trimming data generation circuit including:
      n number of trimming elements having conductive parts that are configured to be blown to produce an electrically open state when an electrical signal of a predetermined magnitude is applied to the conductive parts,
      n number of pull-up resistors connected to high potential sides of the trimming elements,
      n number of buffers,
      n number of protective resistors used to protect the buffers, and
      n number of switches connected to the high potential sides of the trimming elements by way of the protective resistors,
   wherein the trimming data generation circuit switches the switches in accordance with a level of the setting data, and generates the trimming data that is inputted to the trimmed circuit, via the buffers, from nodes at which the pull-up resistors and the trimming elements are connected to each other, and
   wherein the trimming device is configured to perform operations of three phases including a trimming check phase, a trimming element blowing phase, and an actual operation phase based on respective predetermined magnitudes of the electrical signal applied to the conductive parts of the trimming data generation circuit.

2. The trimming device according to claim 1, wherein the trimming check phase includes, prior to any of the conductive parts being blown, outputting by the counter circuit the setting data, and controlling an output of each of the switches according to the setting data output from the counter circuit, such that each of the switches is turned on to output the trimming data having a high potential level from each of the nodes when the setting data has a first level, and is turned off to output the trimming data having a low potential level from each of the nodes when the setting data has a second level,
   wherein the trimming element blowing phase includes providing the electrical signal of the predetermined magnitude to a corresponding node of the nodes which, during the trimming check phase, output the trimming data having the high potential level while an output from the buffers corresponded to a predetermined electrical characteristic value, to thereby blow a predetermined trimming element, and
   wherein the actual operation phase includes, after the trimming element blowing phase, placing the counter circuit in a reset state and causing all the setting data to have the second level.

3. The trimming device according to claim 2, wherein the counter circuit is a binary counter including n number of flip-flops.

4. The trimming device according to claim 3, further comprising:

n number of electrical-signal input pads which are connected to the nodes, and to which the electrical signal is inputted;

a single reset-input pad which is connected to reset terminals of the flip-flops, and to which a reset signal is inputted; and a single clock-input pad which is connected to a clock terminal of a first-stage flip-flop of the flip-flops, and to which a clock signal is inputted.

5. The trimming device according to claim 4, wherein the switches of the trimming data generation circuit are PMOS transistors, wherein one end of each of the pull-up resistors and sources of each of the PMOS transistors are connected to a power supply, wherein the nodes are connected to the other ends of the pull-up resistors, one end of each of the trimming elements, one end of each of the protective resistors, and the electrical-signal input pads, wherein the other ends of the trimming elements are connected to ground, wherein the other ends of the protective resistors are connected to drains of the PMOS transistors, and input terminals of the buffers, wherein output terminals of the buffers are connected to the trimmed circuit, and wherein gates of the PMOS transistors are connected to inversion output terminals of the flip-flops, from which the setting data is outputted.

6. The trimming device according to claim 2, wherein the counter circuit is a shift register including n number of flip-flops.

7. The trimming device according to claim 6, further comprising:

n number of electrical-signal input pads which are connected to the nodes, and to which the electrical signal is inputted;

a single reset-input pad which is connected to reset terminals of the flip-flops, and to which a reset signal is inputted;

a single clock-input pad which is connected to clock terminals of the flip-flops, and to which a clock signal is inputted; and a data input pad which is connected to a data input terminal of a first-stage flip-flop of the flip-flops, and to which a shift register data is inputted.

8. The trimming device according to claim 7, wherein the switches of the trimming data generation circuit are PMOS transistors, wherein one end of each of the pull-up resistors and sources of each of the PMOS transistors are connected to a power supply, wherein the nodes are connected to the other ends of the pull-up resistors, one end of each of the trimming elements, one end of each of the protective resistors, and the electrical-signal input pads, wherein the other ends of the trimming elements are connected to ground, wherein the other ends of the protective resistors are connected to drains of the PMOS transistors, and input terminals of the buffers, wherein output terminals of the buffers are connected to the trimmed circuit, and wherein gates of the PMOS transistors are connected to inversion output terminals of the flip-flops, from which the setting data is outputted.

9. The trimming device according to claim 2, further comprising a control circuit configured to monitor the electrical characteristic value of the trimmed circuit by using the trimming data generated in the trimming check phase, and output, when the electrical characteristic value reaches the predetermined target value, the electrical signal in accordance with a bit value of the trimming data given when the electrical characteristic value reaches the predetermined target value to thereby blow the predetermined trimming element.

10. A method of trimming an electrical characteristic of a device, comprising:

generating n bits of setting data to a trimming data generation circuit including n trimming data units, each trimming data unit including a conductive part configured to be blown to have an open electrical state based on a predetermined current being applied to the conductive part, a switch, a protective resistor connected between the switch and the trimming data unit, and a buffer, such that an output terminal of the switch is connected to one terminal of the conductive part and an input terminal of the buffer, the n bits of setting data are provided to a gate of the respective switches of the n trimming data units such that trimming voltages are output from the buffers of the trimming units based on the trimming data, cycling through different values of the n bits of setting data;

determining a desired trimming data output level corresponding to a predetermined electrical characteristic of the device based on the trimming voltages output from the buffers during the cycling through the different values of the n bits of setting data;

blowing one or more of the conductive parts by applying the predetermined current to the conductive parts based on determining the desired trimming data; and de-asserting the switches of the trimming units to output trimming voltages based only on the one or more blown conductive parts.

11. The method of claim 10, wherein cycling through the different values of the n bits of setting data includes outputting from a plurality of D flip-flops connected in series, an output corresponding to a progressing binary count.

* * * * *